(12) United States Patent
Morin et al.

(10) Patent No.: US 9,331,175 B2
(45) Date of Patent: May 3, 2016

(54) METHOD OF LOCALLY STRESSING A SEMICONDUCTOR LAYER

(71) Applicants: STMicroelectronics SA, Montrogue (FR); STMicroelectronics, Inc., Coppell, TX (US)

(72) Inventors: Pierre Morin, Albany, NY (US); Denis Rideau, Grenoble (FR); Olivier Nier, Varces (FR)

(73) Assignees: STMicroelectronics SA, Montrouge (FR); STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/452,041

(22) Filed: Aug. 5, 2014

(65) Prior Publication Data

US 2015/0044827 A1 Feb. 12, 2015

(30) Foreign Application Priority Data

Aug. 6, 2013 (FR) .................................. 13 57806

(51) Int. Cl.

| H01L 21/00 | (2006.01) |
|---|---|
| H01L 29/66 | (2006.01) |
| H01L 21/02 | (2006.01) |
| H01L 21/324 | (2006.01) |
| H01L 21/762 | (2006.01) |
| H01L 29/78 | (2006.01) |
| H01L 27/12 | (2006.01) |
| H01L 21/84 | (2006.01) |

(52) U.S. Cl.
CPC ...... *H01L 29/66772* (2013.01); *H01L 21/0217* (2013.01); *H01L 21/02532* (2013.01); *H01L 21/324* (2013.01); *H01L 21/76283* (2013.01); *H01L 21/84* (2013.01); *H01L 21/845* (2013.01); *H01L 27/1211* (2013.01); *H01L 29/66795* (2013.01); *H01L 29/7843* (2013.01); *H01L 29/7847* (2013.01)

(58) Field of Classification Search
CPC ................ H01L 29/786; H01L 29/785; H01L 21/76283; H01L 21/324; H01L 21/0217; H01L 21/02532
See application file for complete search history.

(56) References Cited

U.S. PATENT DOCUMENTS

| 4,478,655 A | * | 10/1984 | Nagakubo et al. ............. 438/151 |
|---|---|---|---|
| 5,736,438 A | * | 4/1998 | Nishimura et al. ............ 438/166 |
| 6,642,090 B1 | * | 11/2003 | Fried et al. ..................... 438/164 |
| 7,910,415 B2 | | 3/2011 | Mishima |
| 2006/0001089 A1 | | 1/2006 | Bedell et al. |
| 2007/0017438 A1 | | 1/2007 | Xie et al. |
| 2008/0169508 A1 | | 7/2008 | Chidambarrao et al. |
| 2009/0114955 A1 | | 5/2009 | Stapelmann et al. |

OTHER PUBLICATIONS

Yin, H. et al., "Ultrathin Strained-SOI by Stress Balance on Compliant Substrates and FET Performance", IEEE Transactions on Electron Devices, vol. 52, No. 10, Oct. 1, 2005, pp. 2207-2214.

* cited by examiner

*Primary Examiner* — Richard Booth
(74) *Attorney, Agent, or Firm* — Seed IP Law Group PLLC

(57) ABSTRACT

The disclosure concerns a method of stressing a semiconductor layer comprising: depositing, over a semiconductor on insulator (SOI) structure having a semiconductor layer in contact with an insulating layer, a stress layer; locally stressing said semiconductor layer by forming one or more openings in said stress layer, said openings being aligned with first regions of said semiconductor layer in which transistor channels are to be formed; and deforming second regions of said insulating layer adjacent to said first regions by temporally decreasing, by annealing, the viscosity of said insulator layer.

21 Claims, 4 Drawing Sheets

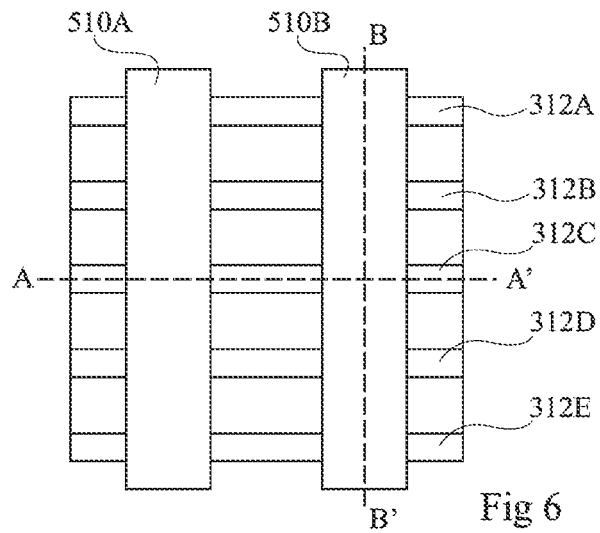
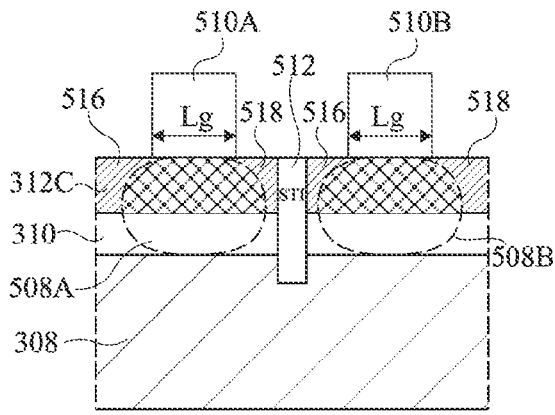
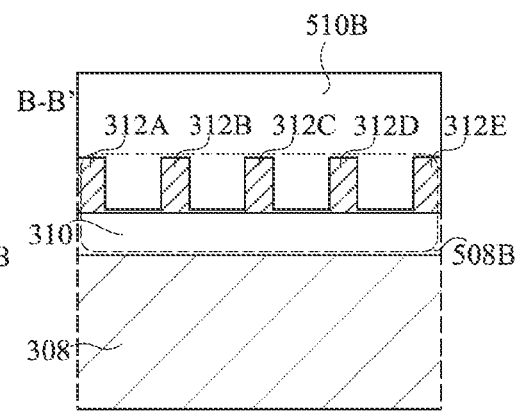
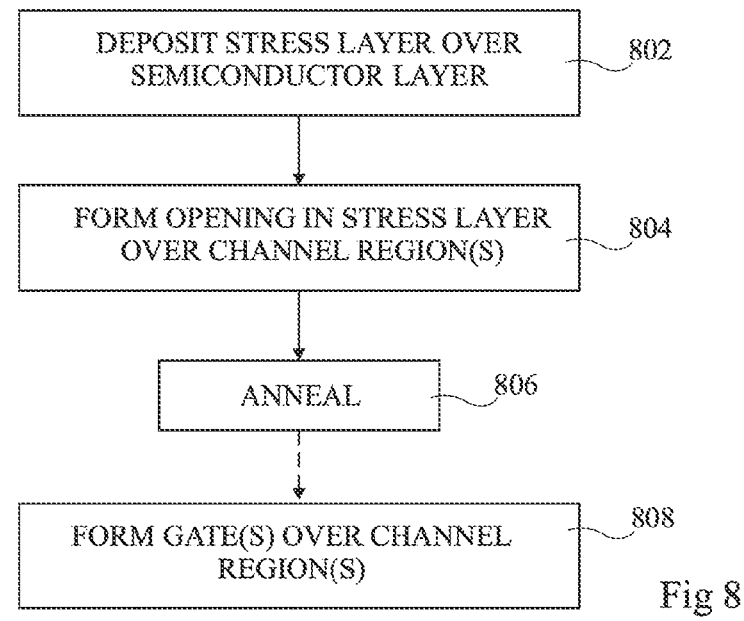

US 9,331,175 B2

METHOD OF LOCALLY STRESSING A SEMICONDUCTOR LAYER

BACKGROUND

1. Technical Field

The present disclosure relates to the field of stressed semiconductor layers, and in particular to a method for forming a stressed semiconductor layer.

2. Description of the Related Art

The performance of certain types of transistors such as p-channel and re-channel MOS transistors can be greatly improved by the introduction of stress into the channel region.

In particular, for P-type metal-oxide-semiconductor (PMOS) transistors, the presence of compressive stress in the channel region generally leads to an increase in hole mobility, and thus an improvement in terms of switching speed.

For N-type metal-oxide-semiconductor (NMOS) transistors, the presence of tensile stress in the channel region generally leads to an increase in the electron mobility, and thus an improvement in terms of switching speed.

However, existing transistor processing methods generally lead to transistors having channels that are stressed in a non-optimal fashion, leading to non-optimal transistor performance. There is thus a need for a method of forming a stressed semiconductor layer leading to increased transistor performance.

BRIEF SUMMARY

According to one aspect, there is provided a method of stressing a semiconductor layer comprising: depositing, over a semiconductor on insulator structure having a semiconductor layer in contact with an insulating layer, a stress layer; locally stressing said semiconductor layer by forming one or more openings in said stress layer, said openings being aligned with first regions of said semiconductor layer in which transistor channels are to be formed; and deforming second regions of said insulating layer adjacent to said first regions by temporally decreasing, by annealing, the viscosity of said insulator layer.

According to one embodiment, the method further comprises: removing the stress layer; and forming a transistor gate over each of said first regions.

According to one embodiment, each of the openings has a width of between 50% and 300% of the length of the transistor gate.

According to one embodiment, the openings comprise a pair of adjacent openings the centers of which are separated by a distance equal to between 80% and 120% of the distance separating the centers of the transistor gates formed over the first regions with which the adjacent openings are aligned.

According to one embodiment, each of the openings has a length of at least 80% of the width of said transistor gate.

According to one embodiment, the stress layer has a thickness equal to at least 150% of the thickness of the semiconductor layer.

According to one embodiment, temporally decreasing the viscosity of the insulator layer comprises annealing at between 950° C. and 1150° C.

According to one embodiment, temporally decreasing the viscosity of said insulator layer comprises annealing at between 900° C. and 1000° C.

According to one embodiment, temporally decreasing the viscosity of said insulator layer comprises annealing for a duration of 30 minutes or less.

According to one embodiment, the insulator layer comprises boron, and temporally decreasing the viscosity of said insulator layer comprises annealing for a duration of 15 minutes or less.

According to one embodiment, temporally decreasing the viscosity of the insulator layer comprises causing a visco-plastic transformation in said second regions without causing visco-plastic transformation in at least some regions of said insulating layer outside said second regions.

According to one embodiment, the stress layer is of SiN or SiGe.

According to one embodiment, the method further comprises forming trenches extending through the semiconductor layer to form isolation regions delimiting one or more transistors.

According to one embodiment, the isolation trenches are formed prior to the annealing.

According to one embodiment, the semiconductor layer comprises a plurality of semiconductor fins, each of said fins comprising one of the second regions.

BRIEF DESCRIPTION OF THE SEVERAL VIEWS OF THE DRAWINGS

The foregoing and other features and advantages will become apparent from the following detailed description of embodiments, given by way of illustration and not limitation with reference to the accompanying drawings, in which:

FIG. 6 is a plan view of the portion of the SOI structure of FIG. 4 during further operations in a method of locally stressing a semiconductor layer according to an embodiment of the present disclosure;

FIGS. 7A and 7B are cross-section views of the SOI structure of FIG. 6 according to an embodiment of the present disclosure; and FIG. 8 is a flow diagram illustrating steps in a method of locally stressing a semiconductor layer according to an embodiment of the present disclosure.

DETAILED DESCRIPTION

Figure 1:
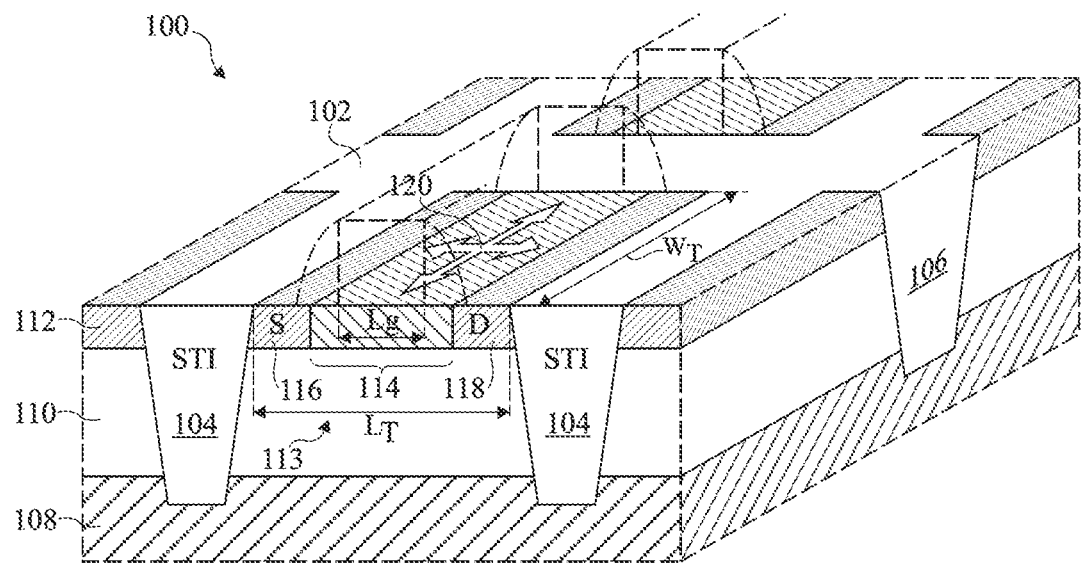
FIG. 1 is a perspective view of a portion of a semiconductor on insulator (SOI) structure comprising a transistor according to an embodiment of the present disclosure.

FIG. 1 is a perspective view of a portion 100 of a semiconductor on insulator (SOI) structure. The SOI structure comprises a grid 102 of isolation trenches, which are for example shallow trench isolations (STI), delimiting transistors. In particular, vertical trenches 104, of which two are illustrated in the portion 100 of FIG. 1, delimit one dimension of each transistor, while horizontal trenches 106, of which one is illustrated in FIG. 1, delimit another dimension of each transistor.

In the example of FIG. 1, the SOI structure comprises a substrate 108, for example formed of bulk silicon, a layer of insulator 110 formed over the substrate 108, and a semiconductor layer 112, formed over and in contact with the insulator layer 110. The insulator layer 110 is for example between 20 and 50 nm in thickness and corresponds to a buried oxide layer, often referred to in the art as a "BOX" layer. The semiconductor layer 112 is for example between 5 and 20 nm in thickness. The semiconductor layer 112 is for example formed of silicon or SiGe.

The isolation trenches 104, 106 for example extend through the semiconductor layers 112 and at least partially into the insulator layer 110. In the example of FIG. 1, the trenches 104, 106 also extend into the substrate 108.

FIG. 1 illustrates an example of a portion of a transistor 113 formed in the semiconductor layer 112, and delimited by the isolation trenches 104 and 106. The transistor 113 is for example a p-channel or n-channel MOS transistor. In the example of FIG. 1, the transistor 113 comprises, between the two trenches 104, a central channel region 114, and source and drain regions 116, 118 on respective sides of the channel region 114. The source and drain regions 116, 118 are for example heavily doped regions of the semiconductor layer 112.

As represented by dashed lines in FIG. 1 over the channel region 114 of transistor 113, a gate stack will for example be formed having spacers partially overhanging the source and drain regions 116, 118. The gate length $L_g$ of the transistor is defined as the dimension of the gate in a direction that is perpendicular to a direction in which the isolation trenches 104 longitudinally extend.

While not illustrated in FIG. 1, there may be hundreds or thousands of p-channel or n-channel transistors formed in the SOI structure and delimited by the grid 102 of isolation trenches 104, 106.

As shown by biaxial arrows 120 positioned over the channel region 114 of the semiconductor layer 112 in FIG. 1, the semiconductor layer 112 is for example stressed. This stress can be a compressive stress, or a tensile stress, and may be biaxial, in other words in both the directions of the transistor length $L_T$ and width $W_T$, or uniaxial, in other words in either the direction of the transistor length $L_T$, or in the direction of the transistor width $W_T$. However, the term "uniaxial stress" will also be used to cover the case in which there is biaxial stress, but the stress levels are different along the transistor's length and width.

Figure 2A:
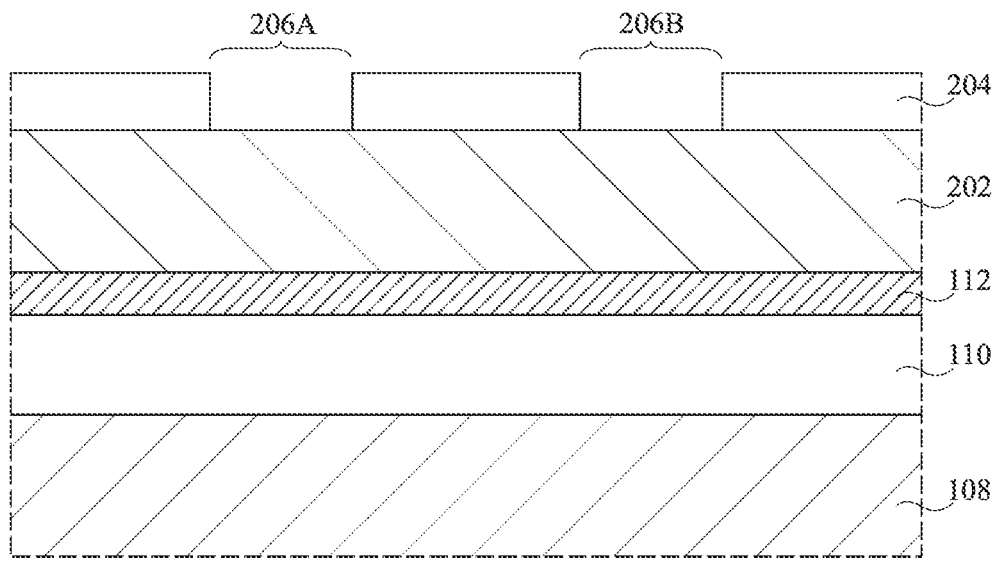
FIGS. 2A to 2C are cross-section views illustrating steps in a method of locally stressing a semiconductor layer according to an embodiment of the present disclosure.
Figure 2B:
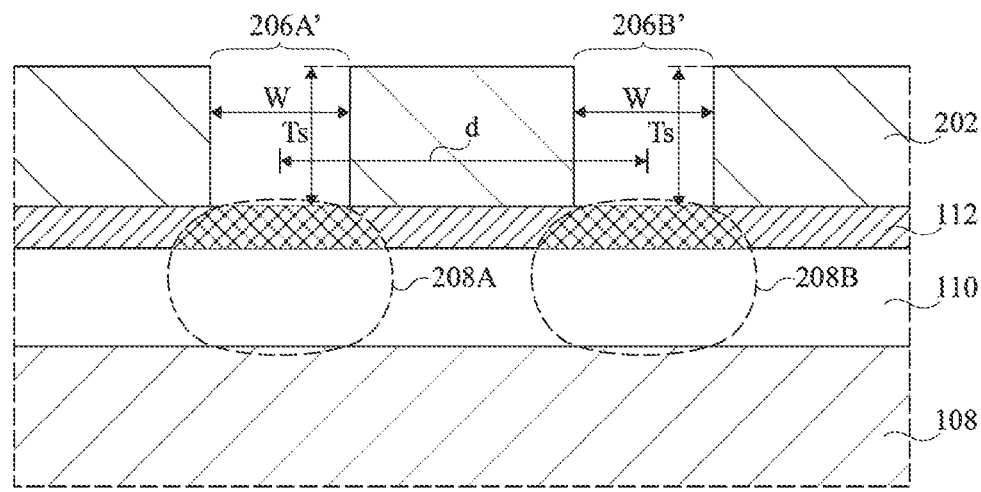
Figure 2C:
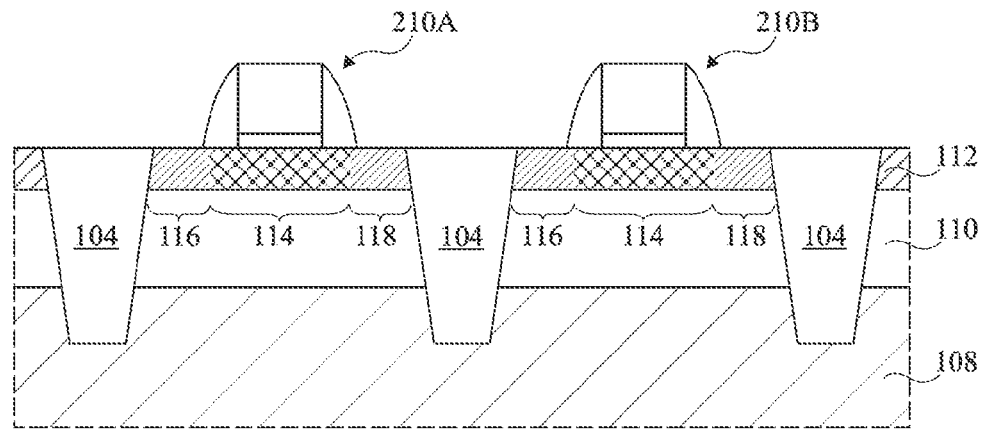

FIGS. 2A to 2C are cross-section views illustrating steps in a method of locally introducing uniaxial or biaxial stress in the channel regions of a semiconductor layer of an SOI structure similar to the one illustrated in FIG. 1.

As shown in FIG. 2A, initially the SOI structure has been formed comprising the substrate 108, insulator layer 110 and semiconductor layer 112. The semiconductor layer 112 is for example not initially stressed. Alternatively, the semiconductor layer 112 may initially be uniaxially or biaxially stressed, and the method described herein can be used to enhance or relax the stress in one axis.

A stress layer 202 is formed over the semiconductor layer 112. The term "stress layer" is used herein to designate a layer of material capable of mechanically stressing one or more layers of the structure. For example, the stress layer is of a stressed material such as silicon nitride, which can be deposited to have a tensile or compressive stress. An alternative example of a material introducing a compressive stress is an epitaxial SiGe layer. For example, the stress in the stress layer 202 is of 1 GPa or more.

For example, in the case that the channel region is a p-type region, a compressive stress layer 202 introducing a compressive stress is for example used. In the case that the channel region is an n-type region, a tensile stress layer 202 introducing a tensile stress is for example used.

In some embodiments, an oxide layer (not illustrated) may be formed over the semiconductor layer 112, prior to depositing the stress layer 202, to improve adhesion.

As also shown in FIG. 2A, a photolithography step is for example used to form a hard mask layer 204 having openings 206A and 206B for use in patterning the stress layer 202.

FIG. 2B illustrates a subsequent step in which etching is used to form openings 206A' and 206B' in the stress layer 202, corresponding to the openings 206A and 206B in the hard mask 204. The openings 206A', 206B' are for example formed using an appropriate etching step, for example using $CH_3F$ in the case that the stress layer 202 is of SiN, or HCL in the case that the stress layer 202 is of SiGe. The hard mask layer 204 is also for example removed. The openings 206A' and 206B' are for example aligned with regions in the underlying semiconductor layer 112 in which transistor channels are to be formed. Thus the distance d between the center of the openings 206A' and 206B' is for example substantially equal to the distance d between the centers of active transistor gates to be formed in the structure. For example, the distance d is equal to between 80% and 120% of the distance between the centers of the active gates to be formed in the structure. In one example, the distance d is equal to at least 40 nm, and could be as high as 1000 nm or more.

As illustrated by dashed circles 208A, 208B in FIG. 2B, after formation of the openings 206A', 206B' in the stress layer 202, the stress applied by the stress layer 202 in the structure is for example localized in the regions of the semiconductor layer 112 underlying the openings 206A', 206B'. Such a stress can be a high percentage of the stress present in the stress layer 202. Furthermore, this stress advantageously extends at least partially into the underlying insulator layer 110.

The depth within the structure to which a relatively high stress is applied by the stress layer 202 is for example determined by the thickness $T_s$ of the stress layer 202, and the width W of the openings 206A', 206B'.

The thickness $T_s$ of the stress layer 202 is for example chosen to be equal to at least 150%, and in some embodiments at least 200%, of the thickness of said semiconductor layer 112. For example, the stress layer thickness $T_s$ is equal or greater than 50 nm, and in some embodiments is between 70 and 100 nm.

Each of the openings 206A', 206B' for example has a width W that is substantially equal to the gate lengths $L_g$ of the transistors to be formed. For example, the width W of each opening 206A', 206B' is equal to between 80% and 300% of the gate lengths $L_g$ of the transistors to be formed. In one example, $T_s$ is equal to approximately 80 nm, W is equal to approximately 40 nm for a gate length $L_g$ of approximately 20 nm, and the SOI thickness is equal to approximately 30 nm.

Each of the openings 206A', 206B' for example corresponds to a trench extending across the structure in the direction that the transistor gates are to be formed. The length of these trenches is for example equal to two or more transistor widths $W_T$ defined in FIG. 1, and such trenches for example result in a substantially uniaxial stress exerted in the channel regions. Alternatively, the openings 206A', 206B' could be rectangular openings of lengths equal to or less than a transistor width $W_T$, leading for example to a biaxial stress in the channel regions.

While the stress is maintained in the semiconductor layer 112, an annealing operation is for example performed to temporally decrease the viscosity of the insulator layer 110 in the stressed regions 208A, 208B underlying the openings 206A', 206B'. The insulator layer 110 is for example of oxide, and the anneal is performed at between 950° C. and 1150° C., for 15 minutes or more. For example, the anneal is performed at between 950° C. and 1050° C. for a duration of between 30 and 60 minutes, or at between 1050° C. and 1150° C. for a duration of between 15 and 45 minutes. Alternatively, the insulator layer 110 could be formed of a material that is naturally of lower viscosity than oxide, for example of BSG (boron silicon glass), and the anneal is performed at between 900° C. and 1100° C. for 5 minutes or more. For example, the anneal is performed at between 900° C. and 1000° C. for a duration of between 15 and 30 minutes, or at between 1000° C. and 1100° C. for a duration of between 5 and 20 minutes. By temporally decreasing the viscosity of the insulator layer 110 when annealed, the insulator layer 110 for example relaxes such that, when it cools again and the viscosity is increased, the stress in the semiconductor layer 112 is maintained not only by the stress layer 202, but also by the regions of the underlying insulator layer 110.

The annealing operation for example leads to a visco-plastic transformation in at least part of the regions 208A, 208B of the insulating layer 110, but not in at least some regions of said insulating layer 110 outside the regions 208A, 208B. In particular, while the viscosity in the insulator layer 110 during annealing will be substantially constant throughout, the deformation of the insulator will be at least partially determined by the level of stress in this layer, the greater the stress, the greater the deformation. Therefore, given the relatively high stress levels in the regions 208A and 208B, a visco-plastic transformation can be isolated to within these regions. This advantageously leads, upon cooling of the insulator layer 110, to a stress that is concentrated locally, and thus at relatively high levels, in the semiconductor layer 112. In particular, the initial relaxation rate over time $d\sigma_T/dt$ at t=0 follows the following relation:

$$\frac{d\sigma_T}{dt}(0) = \frac{Y\sigma_0}{\eta_T}$$

wherein Y is the Young's modulus of the insulator, $\sigma_0$ is the initial stress applied in the insulator layer, and $\eta_T$ is the initial extensional viscosity at temperature T. For a given viscosity $\eta_T$, the higher the stress $\sigma_0$, the higher the relaxation rate $d\sigma_T/dt$.

The annealing operation for example corresponds to the anneal of the STI isolation regions, which will now be described with reference to FIG. 2C.

As shown in FIG. 2C, the stress layer 202 is then for example removed by an appropriate etching step. However, the stress locally introduced in the semiconductor layer 112 at least partially remains.

Isolation trenches 104 are then for example formed delimiting the channel regions associated with the stressed regions 208A and 208B respectively. Furthermore, gate stacks 210A, 210B are for example formed over these channel regions, and source and drain regions 116, 118 are for example formed on each side of the channel regions.

Figure 3:
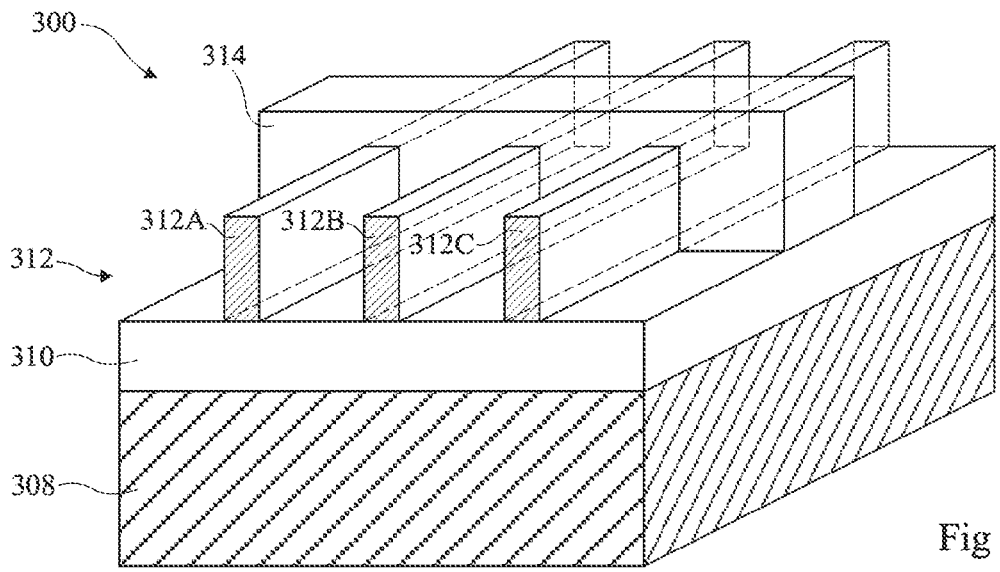
FIG. 3 is a perspective view of a portion of a semiconductor on insulator (SOI) structure comprising a transistor according to a further embodiment of the present disclosure.

FIG. 3 is a perspective view of a portion 300 of a semiconductor on insulator (SOI) structure according to an alternative embodiment based on finFET transistors.

The SOI structure 300 comprises a substrate 308, for example formed of bulk silicon, a layer of insulator 310 formed over the substrate 308, and a semiconductor layer 312, formed over and in contact with the insulator layer 310, and comprising several fins 312A, 312B, 312C, each corresponding to a separate transistor, having a p-type or n-type channel, and controlled by a common gate 314. The insulator layer 310 is for example between 20 and 50 nm in thickness and corresponds to a buried oxide layer. The semiconductor layer 312, and in particular each of the fins 312A to 312C, is for example between 20 and 50 nm in thickness. The semiconductor layer 312 is for example formed of silicon or SiGe.

Figure 4:
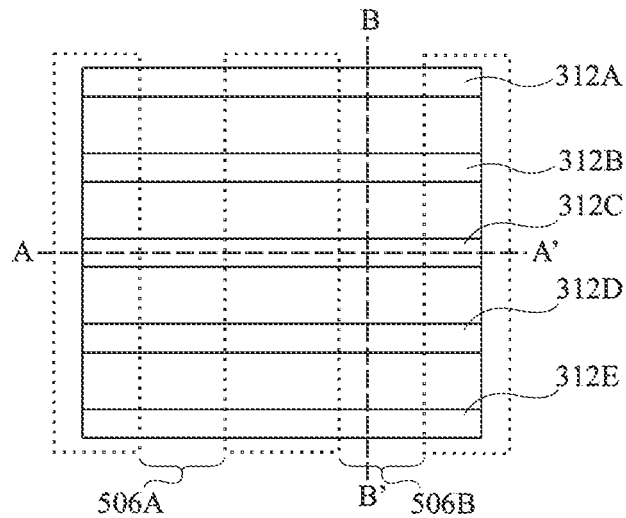
FIG. 4 is a plan view of a portion of an SOI structure during operations in a method of locally stressing a semiconductor layer according to an embodiment of the present disclosure.

FIG. 4 is a plan view illustrating an SOI structure of the type of FIG. 3 during steps in a method of locally stressing the semiconductor layer 312, and in particular the fins. In the example of FIG. 4, the structure comprises five fins 312A to 312E.

Figure 5A:
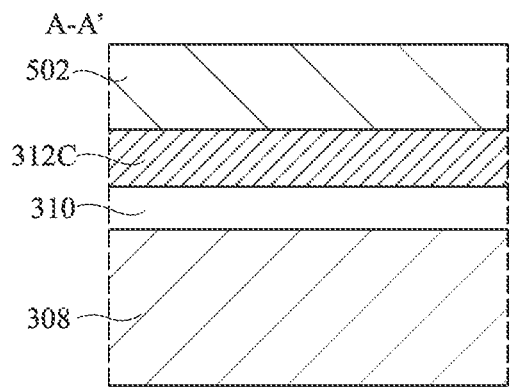
FIGS. 5A to 5D are cross-section views of the SOI structure of FIG. 4 according to an embodiment of the present disclosure.

FIG. 5A is a cross-section view taken along a dashed line A-A' shown in FIG. 4, that extends along the length of the fin 312C.

Figure 5B:
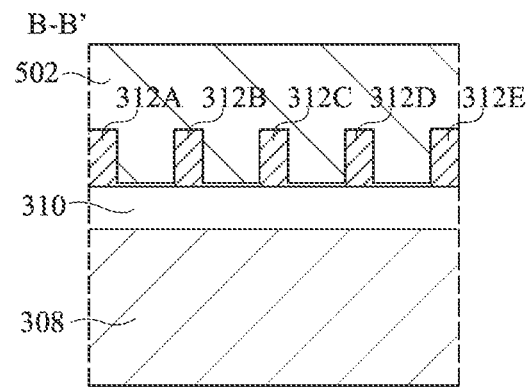

FIG. 5B is a cross-section view taken along a dashed line B-B' shown in FIG. 4, that extends perpendicular to the direction of the fins 312A to 312E.

As shown in FIGS. 5A and 5B, initially the SOI structure has been formed comprising the substrate 308, insulator layer 310 and semiconductor layer 312. The semiconductor layer 312, and in particular the individual fins 312A to 312E, are for example not initially stressed. Alternatively, one or more of these fins may initially be uniaxially or biaxially stressed, and the method described herein can be used to enhance or relax the stress in one axis.

A stress layer 502 is formed over the semiconductor layer 312 and insulator layer 310, and between the fins 312A to 312E. The stress layer 502 is for example similar to the stress layer 202 described above, and will not be described again in detail.

Figure 5C:
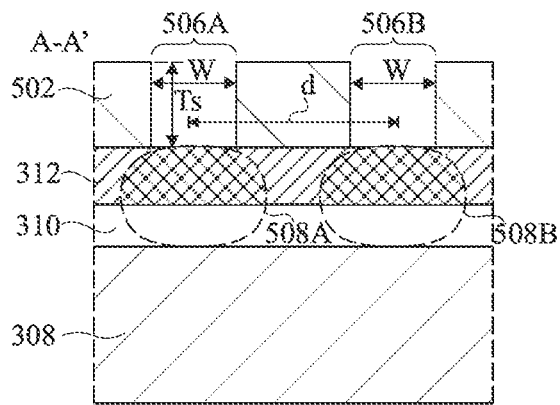

FIG. 5C illustrates the cross-section A-A' after a subsequent step in which openings 506A and 506B are formed in the stress layer 502, for example using a photolithography step.

Figure 5D:
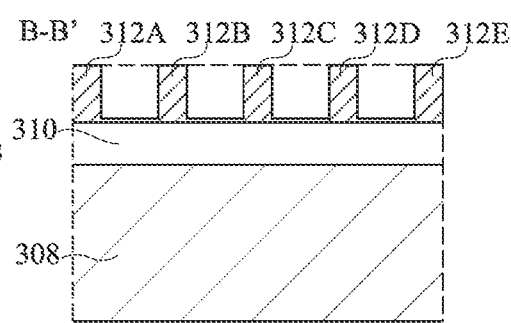

FIG. 5D illustrates the cross-section B-B' after the formation of the openings 506A, 506B. As shown in FIG. 4, the cross-section B-B' for example runs along the length of the opening 506B, the stress layer 502 thus being removed in this view.

The openings 506A and 506B are for example aligned with regions in the underlying semiconductor fins 312A to 312E in which transistor channels are to be formed. Thus the distance d between the center of the openings 506A and 506B is for example substantially equally to the distance d between the centers of transistor gates to be formed in the structure. For example, the distance d is equal to between 80% and 120% of the distance between the centers of gates to be formed in the structure. In one example, the distance d is equal to at least 40 nm, and could be as high as 1000 nm or more.

As illustrated by dashed circles 508A, 508B in FIG. 5C, after formation of the openings 506A, 506B in the stress layer 502, the stress applied by the stress layer 502 in the structure is for example localized in the region of each of the semiconductor fins 312A to 312E underlying the openings 506A, 506B. Such a stress can be a high percentage of the stress present in the stress layer 502. Furthermore, this stress advantageously extends at least partially into the underlying insulator layer 310.

The depth within the structure to which relatively high stress is applied by the stress layer 502 is for example determined by the thickness $T_s$ of the stress layer 502, and the width W of the openings 506A, 506B.

The thickness $T_s$ of the stress layer 502 is for example chosen to be equal to at least 150%, and in some embodiments at least 200%, of the thickness of said semiconductor layer

312. For example, the stress layer $T_s$ is equal or greater than 50 nm, and in some embodiments of between 70 and 100 nm.

Each of the openings 506A, 506B for example has a width W that is substantially equal to the gate lengths $L_g$ of the transistors to be formed. For example, the width W of each opening 506A, 506B is equal to between 80% and 300% of the gate lengths $L_g$ of the transistors to be formed.

Each of the openings 506A, 506B for example corresponds to a trench extending across the structure in the direction that the transistor gates are to be formed. The length of these trenches is for example such that they extend across a plurality of the fins 312A to 312E, and result in a substantially uniaxial stress exerted in the channel regions.

While the stress is maintained in the fins 312A to 312E of the semiconductor layer 312, an annealing operation is for example performed to temporally increase the deformation rate of the insulator layer 310 in the stressed regions 508A, 508B underlying the openings 506A, 506B. The insulator layer 310 is for example of oxide, and the anneal is performed at between 950° C. and 1150° C., for 15 minutes or more. For example, the anneal is performed at between 950° C. and 1050° C. for a duration of between 30 and 60 minutes, or at between 1050° C. and 1150° C. for a duration of between 15 and 45 minutes. Alternatively, the insulator layer 310 could be formed of a material that is naturally of lower viscosity than oxide, for example of BSG (boron silicon glass), and the anneal is performed at between 900° C. and 1100° C. for 5 minutes or more. For example, the anneal is performed at between 900° C. and 1000° C. for a duration of between 15 and 30 minutes, or at between 1000° C. and 1100° C. for a duration of between 5 and 20 minutes. By temporally decreasing the viscosity of the insulator layer 310, the insulator layer 310 for example relaxes such that, when it cools again and its viscosity is increased, the stress in the fins 312A to 312E of the semiconductor layer 312 is maintained not only by the stress layer 502, but also by the regions of the underlying insulator layer 310.

The annealing operation for example leads to a viscoplastic transformation in at least part of the regions 508A, 508B of the insulating layer 310, but not in at least some regions of the insulating layer 310 outside of the regions 508A, 508B. In particular, the deformation rate in the insulator layer 310 during annealing will be at least partially determined by the level of stress in this layer, as described above.

FIG. 6 is a plan view illustrating the SOI structure during further steps in the method of FIGS. 7A and 7B, in which the stress layer 502 has been removed, and gates 510A and 510B have been formed, substantially aligned with the regions in which the trenches 506A and 506B were formed.

FIG. 7A is a cross-section view taken along a dashed line A-A' shown in FIG. 6, that extends along the length of the fin 312C and crosses the gates 510A, 510B. As illustrated in FIG. 7A, an isolation region 512, such as an STI, is for example formed in the semiconductor layer 312 and extends at least into the insulator layer 310, and also into the substrate 308 in the example of FIG. 7A. Furthermore, source and drain regions 516, 518 are formed respectively on either side of the channel regions.

FIG. 7B is a cross-section view taken along a dashed line B-B' shown in FIG. 6, that extends perpendicular to the direction of the fins 312A to 312E, and along the length of the gate 510B.

FIG. 8 is a flow diagram illustrating steps in a method of stressing a semiconductor layer according to an embodiment of the present disclosure.

In a first step 802, a stress layer is deposited over a semiconductor layer of an SOI structure, which is for example the semiconductor layer 112 of FIGS. 2A to 2C, or the semiconductor layer 312 comprising the fins 3A to 3E of FIGS. 5A to 5D.

In a subsequent step 804, the semiconductor layer is locally stressed by forming one or more openings, which are for example aligned with regions of the semiconductor layer in which transistor channels are to be formed.

In a subsequent step 806, an anneal is performed to temporally decrease the viscosity of the insulating layer and thus deform regions that are adjacent to regions of the semiconductor layer in which transistor channels are to be formed.

Optionally, the method further comprises a step 808, in which the stress layer is removed, and one or more gates, such as the gates 210A or 210B of FIG. 2C or the gates 510A, 510B of FIG. 6, are formed over the stressed channel regions.

An advantage of the various embodiments described herein is that stress may be introduced or enhanced in a semiconductor layer in a simple and low cost manner. Advantageously, the stress is applied locally in the channel regions of the semiconductor layer, leading to a concentrated stress that can be maintained in an effective manner by adjacent regions of the insulating layer.

In some embodiments, the stress locally introduced is uniaxial stress. This has the advantage of providing an improved mobility of charge carriers in the channel region of a transistor when compared to a semiconductor layer having a similar level of biaxial stress. In particular, it has been found by the present inventors that enhancing uniaxial stress, for example by introducing stress in one direction or by relaxing a biaxially stressed semiconductor layer in one direction, can lead to a performance gain. For example, in a p-type channel, mobility of charge carriers can be enhanced by the presence of compressive stress in the transistor length direction, and a relaxation or tensile stress in the transistor width direction. In an n-type channel, mobility of charge carriers can be enhanced by the presence of tensile stress in the transistor length direction, and a relaxation or compressive stress in the transistor width direction.

Having thus described at least one illustrative embodiment, various alterations, modifications and improvements will readily occur to those skilled in the art.

For example, while specific examples of materials that may be used to form the stress layers have been described, it will be apparent to those skilled in the art that there are a broad range of equivalent techniques that could be used, employing layers of different materials.

Furthermore, it will be apparent to those skilled in the art that the various features described in relation to the various embodiments described herein may be combined, in alternative embodiments, in any combination.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of stressing a semiconductor layer, comprising:
    depositing a layer of material to form a stressed layer over a semiconductor on insulator (SOI) structure, the SOI structure having a semiconductor layer in contact with an insulating layer;
    locally stressing said semiconductor layer by forming one or more openings in said stressed layer, said openings exposing first regions of said semiconductor layer in which transistor channels are to be formed; and in an annealing step at temperatures between 950° C. and 1150° C., deforming second regions of said insulating layer adjacent to said first regions by temporarily decreasing a viscosity of said insulating layer, thereby causing visco-plastic transformation in the second regions without causing visco-plastic deformation in at least some regions of the insulating layer outside the second regions, wherein the annealing step fixes the local stress in the semiconductor layer.

2. The method of claim 1, further comprising:
removing said stressed layer; and
forming transistor gates over said first regions, respectively.

3. The method of claim 2, wherein each of said openings has a width between 50% and 300% of a length of each transistor gate.

4. The method of claim 2, wherein said openings comprise a pair of adjacent openings having respective centers that are separated by a distance equal to between 80% and 120% of a distance separating centers of said transistor gates formed over the first regions with which said adjacent openings are aligned.

5. The method of claim 2, wherein each of said openings has a length of at least 80% of a width of one of said transistor gates.

6. The method of claim 1, wherein said stressed layer has a thickness equal to at least 150% of a thickness of said semiconductor layer.

7. The method of claim 1, wherein the annealing step comprises annealing at between 900° C. and 1000° C.

8. The method of claim 1, wherein the annealing step comprises annealing for a duration of 30 minutes or less.

9. The method of claim 1, wherein said insulator layer comprises boron, and wherein annealing step comprises annealing for a duration of 15 minutes or less.

10. The method of claim 1, wherein said stressed layer is SiN or SiGe.

11. The method of claim 1, further comprising forming isolation regions delimiting one or more transistors by forming trenches extending through said semiconductor layer.

12. The method of claim 11, wherein said isolation trenches are formed prior to said annealing step.

13. The method of claim 1, wherein said semiconductor layer comprises a plurality of semiconductor fins, each of said fins including one of said second regions.

14. A method, comprising:
forming a stressed layer over a semiconductor layer, the semiconductor layer being located over an insulator layer;
stressing first regions in the semiconductor layer and second regions of the insulator layer adjacent to the first regions by forming openings in the stressed layer, the openings exposing the first regions, and the first regions being at respective locations in which respective transistor channels will be formed; and
fixing the stressed first regions in the semiconductor layer by performing an annealing operation, wherein the fixing includes causing visco-plastic transformation in second regions of the insulator layer without causing visco-plastic deformation in at least some regions of the insulating layer outside the second regions.

15. The method of claim 14, further comprising removing the stressed layer.

16. The method of claim 15, further comprising forming transistor gates over the stressed regions in the semiconductor layer.

17. The method of claim 14, wherein the annealing operation temporarily decreases the viscosity of the insulator layer to at least partially cause the stressed regions to be fixed in the semiconductor layer.

18. The method of claim 14, wherein the annealing operation causes a visco-plastic transformation in second regions in the insulator layer, the second regions in the insulator layer being respectively adjacent to the stressed regions in the semiconductor layer.

19. The method of claim 14, further comprising delimiting one or more transistors by forming isolation trenches extending through the semiconductor layer.

20. The method of claim 14, wherein the stressed regions in the semiconductor layer are fixed by the insulator layer.

21. The method of claim 14, wherein the semiconductor layer includes one or more fins, each fin corresponding to a separate transistor to be formed.

* * * * *